(12) United States Patent
Wen et al.

(10) Patent No.: US 6,268,114 B1
(45) Date of Patent: Jul. 31, 2001

(54) METHOD FOR FORMING FINE-PITCHED SOLDER BUMPS

(75) Inventors: Ying-Nan Wen; Ling-Chen Kung; Szu-Wei Lu; Ruoh-Huey Uang, all of Hsinchu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/156,353

(22) Filed: Sep. 18, 1998

(51) Int. Cl.[7] ................................................. G03C 5/00
(52) U.S. Cl. .................. 430/314; 430/312; 430/318; 430/319
(58) Field of Search .................................. 430/311, 312, 430/313, 314, 315, 318, 319; 427/96, 98, 99

(56) References Cited

U.S. PATENT DOCUMENTS

| | | | |
|---|---|---|---|
| 4,950,623 | * 8/1990 | Dishon | 437/183 |
| 5,282,565 | * 2/1994 | Melton | 228/180.22 |
| 5,736,456 | * 4/1998 | Akram | 438/614 |
| 5,767,010 | * 6/1998 | Mis et al. | 438/614 |
| 5,960,308 | * 9/1999 | Akagawa et al. | 438/613 |

* cited by examiner

Primary Examiner—Mark F. Huff
Assistant Examiner—Saleha R. Mohamedulla
(74) Attorney, Agent, or Firm—Tung & Associates

(57) ABSTRACT

A method for forming solder balls that have larger spacings between them and electronic devices containing such solder balls are disclosed. In the method, an additional layer of a leachable metal such as gold or silver is used between an under bump metallurgy layer and a solder bump subsequently formed. This allows the formation of the under bump metallurgy layer prior to the deposition of the solder material into a window formed in a photoresist layer. The present invention allows the underfill of a solder window, instead of an overfill which is normally required in a conventional method.

22 Claims, 3 Drawing Sheets

METHOD FOR FORMING FINE-PITCHED SOLDER BUMPS

FIELD OF THE INVENTION

The present invention generally relates to a method for forming solder bumps and devices formed and more particularly, relates to a method for forming fine-pitched solder bumps by incorporating an additional coating layer of leachable metal between an under bump metallurgy and solder ball such that a photoresist layer which has a larger thickness may be used to form solder bumps at a smaller pitch distance and semiconductor devices formed by such method.

BACKGROUND OF THE INVENTION

In the fabrication of modem semiconductor devices, the ever increasing device density and decreasing device dimensions demand more stringent requirements in the packaging or interconnecting techniques of such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become impractical for several reasons. One of the problems in utilizing solder paste screening technique in bonding modern semiconductor devices is the paste composition itself. A solder paste is formed by a flux material and solder alloy particles. The consistency and uniformity of the solder paste composition become more difficult to control as the solder bump volume decreases. Even though a solution of the problem has been proposed by using solder paste that contain extremely small and uniform solder particles, it can only be achieved at a high cost penalty. A second problem in utilizing the solder paste screening technique in modern high density semiconductor devices is the available space between solder bumps. It is known that a large volume reduction occurs when a solder changes from a paste state to a cured stated, the screen holes for the solder paste must be significantly larger in diameter than the actual solder bumps to be formed. The large volume shrinkage ratio thus makes the solder paste screening technique difficult to carry out in high density devices.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1H.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion diffusion barrier layer 30 and a wetting layer 28. The adhesion diffusion barrier layer 30 may be formed of Ti, TiN or other metal such as Cr. The wetting layer 28 is normally formed of a Cu layer or a Ni layer. The UMB layer 26 improves bonding between a solder ball to be formed and the top surface 18 of the bond pad 14.

In the next step of the process, as shown in FIG. 1C, a photoresist layer 34 is deposited on top of the UMB layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

FIG. 1G shows an enlarged, cross-sectional view of the solder bump 40 of FIG. 1D. The mushroom-shaped solder bump is formed over the photoresist layer 34. The dimension for the base of the solder bump is X=150 μm, for the outer diameter of the mushroom is Y=205 μm, for the height of the base of the solder bump is h=34 μm, and for the total height of the mushroom configuration is H=62 μm. In this specific example, it is seen that the total height of the mushroom is almost twice as the height of the base of the solder bump in the window and furthermore, the outside diameter of the mushroom is significantly larger than the outside diameter of the base portion of the solder bump 40. A comparison in the areas occupied by the base portion 46 and the top portion of the mushroom 48 is shown in FIG. 1H. A simple calculation indicates that the total area occupied by the mushroom 48 is 32,900 μm$^2$, compared to a total area occupied by the base portion 46 of 17,600 μm$^2$. The total chip real estate occupied by the mushroom portion is therefore almost twice as large as that occupied by the base portion of the solder bump. In other words, almost twice as much space is needed for forming a solder bump which has the mushroom configuration. The height of the solder ball 42 formed after the reflow process is approximately 100 μm.

It is therefore an object of the present invention to provide a method for forming solder balls that do not have the drawbacks or shortcomings of the conventional methods.

It is another object of the present invention to provide a method for forming solder balls by utilizing an additional leachable metal layer between an under bump metallurgy layer and the solder bump such that a larger spacing between the solder balls can be achieved.

It is a further object of the present invention to provide a method for forming solder balls by depositing a solder material by a technique of electrodeposition, screen printing or physical vapor deposition.

It is another further object of the present invention to provide a method for forming solder balls by utilizing a photoresist layer which has a larger thickness and filling a window in the photoresist layer with electrodeposited solder material without a mushroom configuration.

It is still another object of the present invention to provide a method for forming a fine-pitched solder bumps by utilizing an additional layer of a leachable metal between an under bump metallurgy layer and the solder ball wherein the leachable metal is deposited by sputtering or evaporation.

It is yet another object of the present invention to provide a method for forming fine-pitched solder bumps by electrodepositing a solder material into a window formed in a photoresist layer wherein the solder material consists mainly of tin and lead.

It is still another further object of the present invention to provide a solder bump structure formed on an electronic substrate that has an interface between the solder ball and the under bump metallurgy layer comprises atoms of a leachable metal of silver or gold.

It is yet another further object of the present invention to provide a method for forming fine-pitched solder bumps by utilizing an additional leachable metal layer of silver or gold inbetween an under bump metallurgy layer and a solder bump such that the leachable metal melts into the solder bump after a reflow process.

SUMMARY OF THE INVENTION

In accordance with the present invention, a method for forming solder balls by utilizing an additional layer of a leachable metal such as silver or gold between an under bump metallurgy layer and a solder bump such that the under bump metallurgy layer can be first defined and then a photoresist layer of larger thickness can be used for electrodepositing a solder material therein without forming a mushroom configuration and thereby providing more space between the solder bumps formed is provided.

In a preferred embodiment, a method for forming solder balls can be carried out by the operating steps of first providing a pre-processed electronic substrate which has a bond pad formed on top, the bond pad is covered by an insulating layer except a portion adapted for receiving a solder bump, depositing an under bump metallurgy layer on top of the substrate, patterning the under bump metallurgy layer and removing the layer except the area overlapping the bond pad, depositing a layer of a leachable metal on top of the insulating layer and the under bump metallurgy layer, depositing a photoresist layer on top of the leachable metal layer, patterning the photoresist layer and opening a window to expose an area of the leachable metal layer that covers the bond pad, depositing a solder material into the window on top of the leachable metal layer, removing the photoresist layer and heating the solder material to a temperature at least the reflow temperature of the solder material for forming a ball and for leaching the leachable metal layer into the ball.

The under bump metallurgy layer includes an adhesion barrier layer and a wetting layer selected from the group consisting of Ti/Cu, TiN/Cu, Cr/Ni, Al/Ni—V/Cu and Cr/CrCu/Cu/Au. The layer of a leachable metal deposited can be silver or gold to a thickness between about 100 Å and about 2,000 Å. The leachable metal can be deposited by a technique of sputtering, electroplating or evaporation. The solder material deposited into the window in the photoresist layer has a thickness smaller than the thickness of the photoresist layer. The solder material can be deposited by an electrodeposition technique. The solder material may also be deposited by a technique of screen printing or physical vapor deposition. The solder material contains substantially of tin and lead which may be selected from the group consisting of 63/37 tin/lead, 5/95 tin/lead, 60/40 tin/lead, 3/97 tin/lead and other suitable solders. The method may further include the step of removing the photoresist layer, except when the photoresist layer is a epoxy based photoresist material or a polyimide-based photoresist material.

In another preferred embodiment, a method for forming fine-pitched solder bumps can be carried out by the steps of first providing a pre-processed electronic substrate which has a bond pad formed on top, the bond pad is covered by an insulating layer except a center portion adapted for receiving a solder bump, depositing an under bump metallurgy layer on top of the substrate, depositing a first photoresist layer on the under bump metallurgy layer, patterning the first photoresist layer and removing the under bump metallurgy layer except an area overlapping the bond pad, depositing a layer of a leachable metal on top of the electronic substrate, depositing a second photoresist layer on top of the leachable metal layer, patterning the second photoresist layer and opening a window to expose an area of the leachable metal layer that covers the bond pad, electrodepositing a solder material into the window on top of the leachable metal layer, removing the photoresist layer, and heating the solder material to a temperature at least the reflow temperature of the solder for forming a solder bump and for melting the leachable metal layer into the solder bump.

The under bump metallurgy includes an adhesion layer and a diffusion barrier layer which may be selected from the group consisting of Ti/Cu, TiN/Cu, Cr/Ni, Al/Ni—Cu and Cr/CrCu/Cu/Au. The layer of a leachable metal is deposited by sputtering or evaporation to a thickness between about 100 Å and about 2000 Å. The layer of the leachable metal deposited may be silver or gold. The second photoresist layer has a larger thickness than the first photoresist layer and is adapted for receiving a layer of solder material in the window to a thickness smaller than the thickness of the second photoresist layer. The solder material may be deposited into the window by a screen printing method or an electrodeposition method. The solder material deposited consists mainly of tin and lead.

The present invention is further directed to a solder bump structure formed on an electronic substrate which includes a pre-processed substrate that has a top surface, a bond pad on the top surface, an under bump metallurgy layer on the bond pad, and a solder ball integrally joined to the under bump metallurgy layer forming an interface therebetween, the interface includes atoms of a leachable metal of silver or gold. The under bump metallurgy layer may include am adhesion layer, a barrier layer and wetting layers such as those selected from the group consisting of Ti/Cu, TiN/Cu, Cr/Ni, Al/Ni—V/Cu and Cr/CrCu/Cu/Au. The solder ball consists mainly of tin, lead or other metals. The atoms of silver or gold at the interface are formed by a leachable metal layer deposited between the under bump metallurgy and the solder ball.

BRIEF DESCRIPTION OF THE DRAWINGS

These objects, features and advantages will become apparent by the following specification and the appended drawings in which.

DETAILED DESCRIPTION OF THE PREFERRED EMBODIMENT

The present invention discloses a method for forming solder balls on a semiconductor structure by utilizing an additional leachable metal layer between an under bump metallurgy layer and a solder bump such that solder balls that have increased spacing between the balls can be formed. The present invention utilizes a novel layer of a leachable metal such that fine-pitched solder balls can be formed. In the present invention novel method, an under bump metallurgy layer is first deposited and defined to cover only the bond pad such that in a subsequent solder filling process, there is no need to overfill solder material and thus no mushroom configuration is formed. Significant space savings between the solder bumps is thus realized and furthermore, solder balls of smaller spacing therebetween are formed.

Figure 2A:
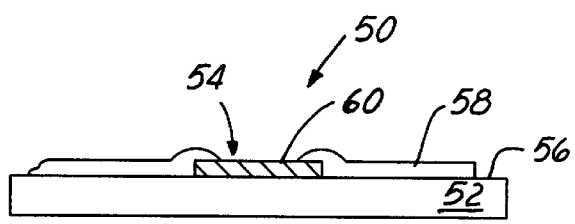
FIG. 2A is an enlarged, cross-sectional view of a present invention semiconductor structure which has a bond pad and a passivation layer formed on top.

Referring initially to FIG. 2A, wherein an enlarged, cross-sectional view of a present invention semiconductor structure 50 is shown. The semiconductor structure 50 is built on a pre-processed semiconductor substrate 52 which contains active devices such as transistors and a bond pad 54 built on top. On a top surface 56 of the substrate 52, a passivation layer 58 is then deposited and defined to expose a center portion 60 of the bond pad 54. The center portion 60 provides a base location for the solder bump formation.

Figure 2B:
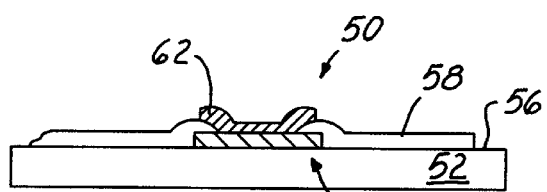
FIG. 2B is an enlarged, cross-sectional view of the present invention semiconductor structure of FIG. 1A which has an under bump metallurgy deposited and defined on top of the bond pad.

On top of the bond pad 54, an under bump metallurgy layer 62 is then deposited and defined to only cover the center portion of the bond pad 64. The under bump metallurgy layer may consist of an adhesion layer, a diffusion barrier layer and wetting layer such as a combination of Ti/Cu, TiN/Cu, Cr/Ni, Al/Ni—V/Cu or Cr/CrCu/Cu/Au. Various other under bump metallurgy layers formed of other suitable materials may also be utilized in the present invention novel method. The under bump metallurgy (or the ball limiting metallurgy) layer may be deposited as a thin film and then etched, it may also be deposited by an electroless plating technique. This is shown in FIG. 2B.

Figure 2C:
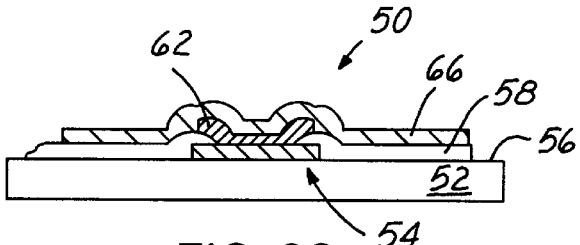
FIG. 2C is an enlarged, cross-sectional view of the present invention semiconductor structure of FIG. 2B which has a leachable metal layer deposited on top.
Figure 2D:
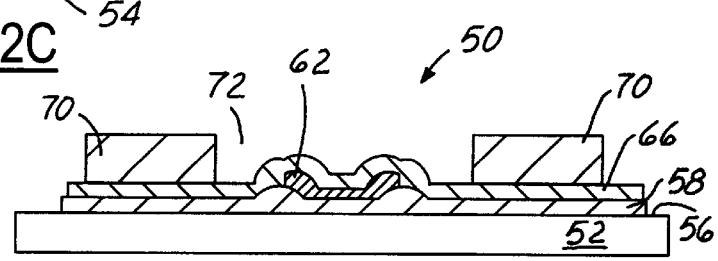
FIG. 2D is an enlarged, cross-sectional view of the present invention semiconductor structure of FIG. 2C which has a photoresist layer deposited on top and a window defined for the solder bump.

In the next step of the present invention novel method, as shown in FIG. 2C, a leachable metal layer 66 is deposited on top of the passivation layer 58 and the under bump metallurgy layer 62. A suitable leachable metal material may be silver, gold or any other suitable material. The leachable metal layer 66 may be deposited by any suitable techniques, among them the evaporation technique, the sputtering technique and electroless plating technique. A suitable thickness of the leachable metal layer 66 may be in the range between about 100 Å and about 2,000 A, preferably between about 500 Å and about 1,500 Å. The leachable metal material can be readily absorbed, or diffused into a solder material during a solder reflow process at a sufficiently high temperature such that the leachable layer 66 completely disappears after the reflow process.

Figure 1A:
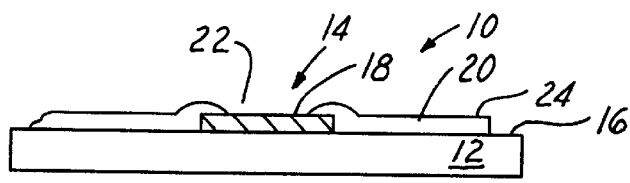
FIG. 1A is an enlarged, cross-sectional view of a conventional pre-processed substrate which has a bond pad and a passivation layer formed on top.
Figure 1B:
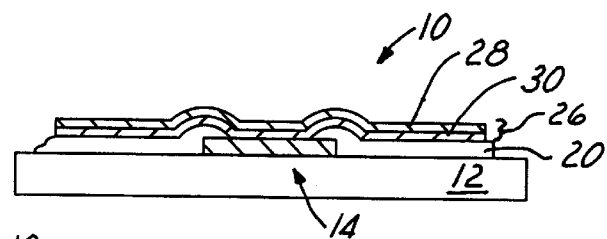
FIG. 1B is an enlarged, cross-sectional view of the conventional semiconductor structure of FIG. 1A which has an under bump metallurgy layer formed on top.
Figure 1C:
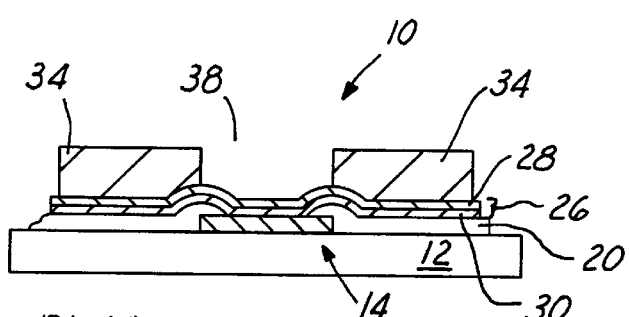
FIG. 1C is an enlarged, cross-sectional view of the conventional semiconductor structure of FIG. 1B which has a photoresist layer deposited and defined on top.
Figure 1D:
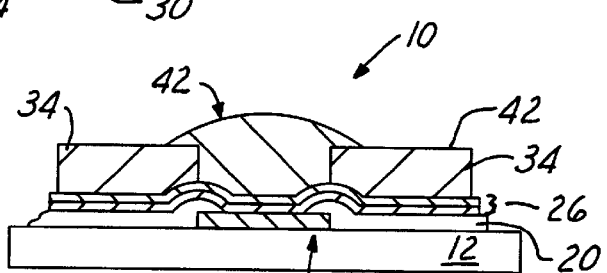
FIG. 1D is an enlarged, cross-sectional view of the conventional semiconductor structure of FIG. 1C which has a solder material deposited into the window for the solder bump.
Figure 1E:
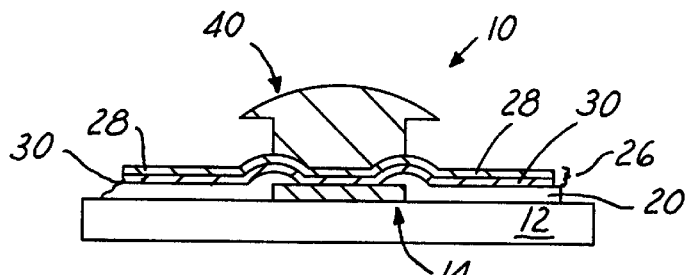
FIG. 1E is an enlarged, cross-sectional view of the conventional semiconductor structure of FIG. 1D which has the photoresist layer removed in a wet etching process.
Figure 1F:
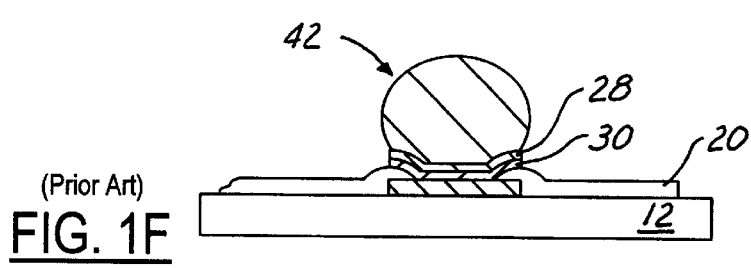
FIG. 1F is an enlarged, cross-sectional view of the conventional semiconductor structure of FIG. 1E which has the exposed under bump metallurgy layer removed and the solder bump reflowed into a solder ball.
Figure 1G:
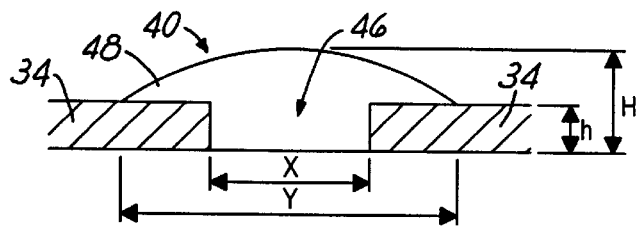
FIG. 1G is an enlarged, cross-sectional view of the solder bump in FIG. 1D illustrating the relative dimensions.
Figure 1H:
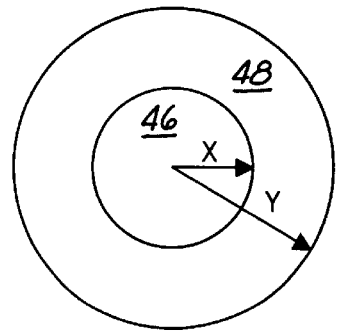
FIG. 1H is an enlarged, plane view of the solder bump of FIG. 1G illustrating the relative areas of the base solder bump and the top of solder bump.

The semiconductor structure 50 is then coated with a photoresist layer 70 and patterned for a window area 72 for the subsequent forming of a solder bump. The present invention novel method allows the utilization of a photoresist layer that is thicker than those normally used at about 35 µm. For instance, photoresist layers as thick as 100 µm can be utilized. The capability of using thick photoresist layer is one of the important aspects of the present invention. Since the present invention allows solder balls having larger distances between the balls to be formed, the resolution required of the photoresist layer is not as critical as those demanded in the conventional processes. As a result, significantly thicker photoresist layer can be used and furthermore, the overfill of the solder material seen in the conventional method (FIG. 1D) is not necessary. This enables the filling of a window area with a solder material to a thickness smaller than the thickness of the photoresist layer.

Figure 2E:
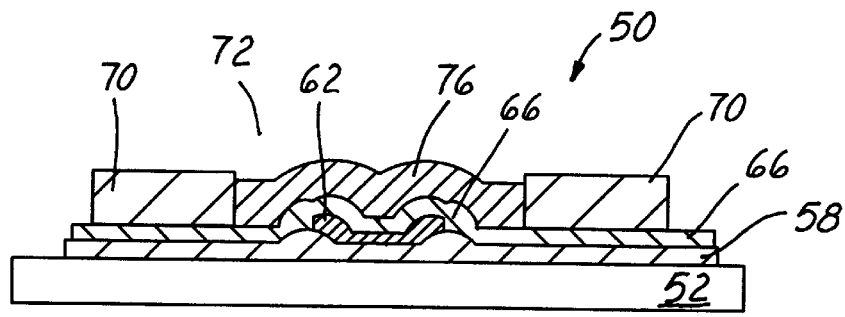
FIG. 2E is an enlarged, cross-sectional view of the present invention semiconductor structure of FIG. 2D which has a solder material filling the window area.

As shown in FIG. 2E, a solder material 76 is filled into the window area 72 formed in a previous process defined by the photoresist pattern 70. It is noted that the thickness of the solder material 76 filled into window 72 is smaller than the thickness of the photoresist mask 70. The overfill, i.e., the formation of the mushroom configuration, in the conventional process is avoided in the present invention novel method. This is made possible by the use of a thicker photoresist layer 70, i.e., at a thickness between about 35 µm and about 100 µm.

Figure 2F:
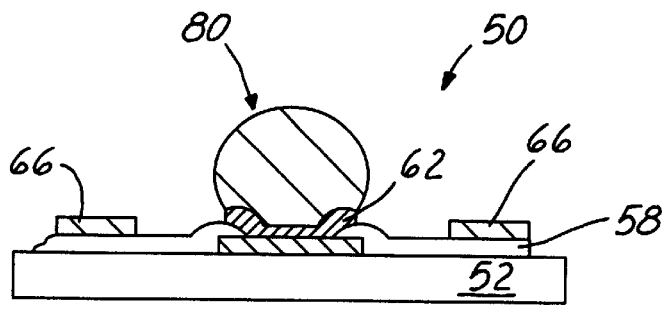
FIG. 2F is an enlarged, cross-sectional view of the present invention semiconductor structure of FIG. 2E which has the solder bumper reflowed into a solder ball and the leachable metal melted into the solder material.

In the final step of the process, as shown in FIG. 2F, the photoresist layer 70 is first removed in a wet stripping process. It should be noted that, when a solder mask is used as the masking material, instead of a photoresist mask, the solder mask does not need to be removed. In the reflow process, solder materials consist mainly of tin/lead at various composition ratios, e.g., 63/37, 5/95, 60/40 and 3/97 of tin/lead may be used. During the reflow process, the furnace temperature is set to at least the reflow temperature of the solder material such that, after a reflow process, a solder ball 80 is formed. During the reflow process, the leachable metal layer 66 is melted, and then diffused into the solder ball 80 and thus completely disappears under the solder ball 80. However, a chemical analysis at an interface between the solder ball 80 and the under bump metallurgy layer 62 reveals that it contains atoms of the leachable metal of gold or silver. The chemical analysis therefore provides a proof that whether a leachable metal layer has been used between a solder bump and an under bump metallurgy layer.

Figure 3:
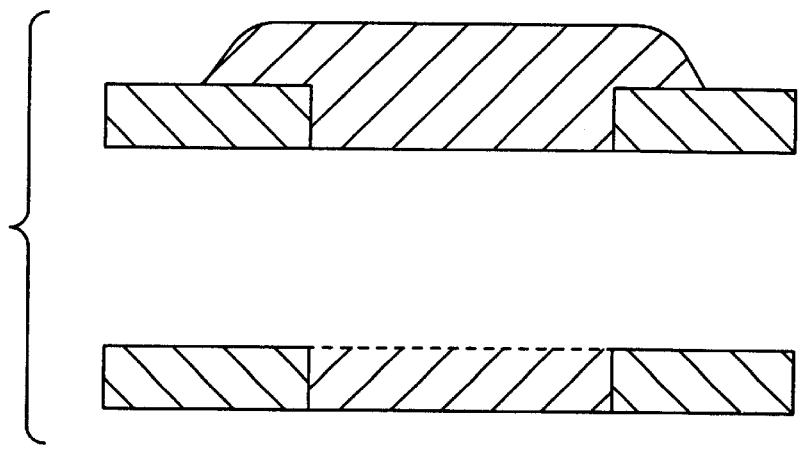
FIG. 3 are enlarged, cross-sectional views of a present invention solder bump and a conventional solder bump.

FIG. 3 shows enlarged, cross-sectional views of a present invention solder bump and a conventional solder bump. It is seen that the reduced pitch for the present invention solder bump can be calculated as 2 ($r_1-r_3$).

The present invention novel method for forming a fine-pitched solder ball and devices formed by such method have therefore been amply demonstrated in the above descriptions and the appended drawings of FIGS. 2A~2F. The present invention novel method provides several benefits including one such as a substantially similar process receipt can be used to practice the present invention method to produce solder balls that have larger spacing between the balls. The present invention method also allows the use of photoresist layers of larger thicknesses since imaging resolution is not critical in the present invention method. The thicker photoresist layer utilized allows an underfill of the solder window, instead of the overfill normally required in the conventional method. The spacing between the solder balls formed are thus improved without the solder overfill and the formation of a mushroom configuration of the solder bump.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for forming fine-pitched solder bumps comprising the steps of:
   providing a pre-processed electronic substrate having a bond pad formed on top, said bond pad being covered by an insulating layer except a portion for receiving a solder bump,
   depositing an under bump metallurgy layer on top of said substrate,
   patterning said under bump metallurgy layer and removing said under bump metallurgy layer except the area overlapping said bond pad,
   depositing a layer of a leachable metal on top of said insulating layer and said under bump metallurgy layer,
   depositing a photoresist layer on top of said leachable metal layer,
   patterning said photoresist layer and opening a window to expose an area of said leachable metal layer that covers said bond pad,
   depositing a solder material into said window on top of said leachable metal layer, and
   heating said solder material to a reflow temperature of said solder material for forming a ball and for leaching said leachable metal layer into said ball.

2. A method for forming fine-pitched solder bumps according to claim 1, wherein said under bump metallurgy layer comprises an adhesion layer, a barrier layer and a wetting layer.

3. A method for forming fine-pitched solder bumps according to claim 1, wherein said under bump metallurgy layer is selected from the group consisting of Ti/Cu, TiN/Cu, Cr/Ni, Al/Ni—V/Cu and Cr/CrCu/Cu/Au.

4. A method for forming fine-pitched solder bumps according to claim 1, wherein said layer of a leachable metal deposited is of Ag or Au.

5. A method for forming fine-pitched solder bumps according to claim 1, wherein said layer of a leachable metal is deposited to a thickness between about 100 Å and about 2000 Å.

6. A method for forming fine-pitched solder bumps according to claim 1, wherein said leachable metal is deposited by a technique of sputtering, evaporation or electroless plating.

7. A method for forming fine-pitched solder bumps according to claim 1, wherein said solder material deposited into said window in said photoresist layer has a thickness smaller than the thickness of the photoresist layer.

8. A method for forming fine-pitched solder bumps according to claim 1, wherein said solder material is deposited by an electrodeposition technique.

9. A method for forming fine-pitched solder bumps according to claim 1, wherein said solder material is deposited by a technique selected from the group consisting of electrodeposition, screen printing and physical vapor deposition.

10. A method for forming fine-pitched solder bumps according to claim 1, wherein said solder material deposited comprises substantially Sn and Pb.

11. A method for forming fine-pitched solder bumps according to claim 1, wherein said solder material deposited is selected from the group consisting of 63/37 Sn/Pb, 5/95 Sn/Pb, 60/40 Sn/Pb and 3/97 Sn/Pb in weight percent Sn/Pb.

12. A method for forming fine-pitched solder bumps according to claim 1 further comprising a step of removing said photoresist layer.

13. A method for forming fine-pitched solder bumps according to claim 1, wherein said photoresist layer comprises an epoxy-based photoresist material or a polyimide-based photoresist material.

14. A method for forming fine-pitched solder bumps according to claim 13, wherein said photoresist layer is not removed from said electronic substrate.

15. A method for forming fine-pitched solder bumps comprising the steps of:

providing a pre-processed electronic substrate having a bond pad formed on top, said bond pad being covered by an insulating layer except a center portion for receiving a solder bump, depositing an under bump metallurgy layer on top of said substrate, depositing a first photoresist layer on said under bump metallurgy layer, patterning said first photoresist layer and removing the under bump metallurgy layer except an area overlapping said bond pad, depositing a layer of a leachable metal on top of said electronic substrate, depositing a second photoresist layer on top of said leachable metal layer, patterning said second photoresist layer and opening a window to expose an area of said leachable metal layer that covers said bond pad, electrodepositing a solder material into said window on top of said leachable metal layer, removing said second photoresist layer, and heating said solder material to a reflow temperature of said solder material for forming a solder bump and for melting said leachable metal layer into said solder bump.

16. A method for forming fine-pitched solder bumps according to claim 15, wherein said under bump metallurgy layer comprises a diffusion barrier layer and an adhesion layer.

17. A method for forming fine-pitched solder bumps according to claim 15, wherein said under bump metallurgy layer is selected from the group consisting of Ti/Cu, TiN/Cu, Cr/Ni, Al/Ni—V/Cu and Cr/CrCu/Cu/Au.

18. A method for forming fine-pitched solder bumps according to claim 15, wherein said layer of a leachable metal is deposited by sputtering, evaporation or electroless plating to a thickness between about 100 Å and about 2000 Å.

19. A method for forming fine-pitched solder bumps according to claim 15, wherein said layer of a leachable metal deposited is Ag or Au.

20. A method for forming fine-pitched solder bumps according to claim 15, wherein said second photoresist layer has a larger thickness than said first photoresist layer and is adapted for receiving a layer of solder material in the window to a thickness smaller than the thickness of the second photoresist layer.

21. A method for forming fine-pitched solder bumps according to claim 15, wherein said solder material is deposited into said window by a screen printing method.

22. A method for forming fine-pitched solder bumps according to claim 15, wherein said solder material deposited comprises Sn and Pb.

* * * * *

UNITED STATES PATENT AND TRADEMARK OFFICE
CERTIFICATE OF CORRECTION

PATENT NO. : 6,268,114 B1
DATED : July 31, 2001
INVENTOR(S) : Ying-Nan Wen

It is certified that error appears in the above-identified patent and that said Letters Patent is hereby corrected as shown below:

<u>Title page,</u>
Item [73], Assignee, should read -- Industrial Technology Research Institute --.

Signed and Sealed this

Twenty-fifth Day of April, 2006

JON W. DUDAS
*Director of the United States Patent and Trademark Office*